(12) United States Patent
Kamikawa

(10) Patent No.: US 6,510,859 B1
(45) Date of Patent: Jan. 28, 2003

(54) APPARATUS AND METHOD FOR CLEANING AND DRYING OBJECT

(75) Inventor: Yuji Kamikawa, Koshi-Machi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/615,620

(22) Filed: Jul. 13, 2000

(30) Foreign Application Priority Data

Jul. 15, 1999 (JP) .......................................... 11-201414

(51) Int. Cl.$^7$ ................................................ B08B 3/10
(52) U.S. Cl. ...................... 134/61; 134/95.1; 134/95.2; 134/100.1; 134/902
(58) Field of Search ................... 134/61, 95.1, 95.2, 134/95.3, 100.1, 902; 422/186.12

(56) References Cited

U.S. PATENT DOCUMENTS 6,039,815 A * 3/2000 Yeol et al. .............. 134/902 X
6,131,588 A * 10/2000 Kamikawa et al. ...... 134/102.3

FOREIGN PATENT DOCUMENTS

JP 228328 * 10/1991 ................. 134/902

* cited by examiner

Primary Examiner—Philip Coe
(74) Attorney, Agent, or Firm—Morrison & Foerster LLP

(57) ABSTRACT

A small-sized cleaning and drying apparatus is provided. Without generating particles, hydrogen gas, etc., the apparatus easily generates an ozone water to form an oxidation film on an object to be processed. The apparatus includes a cleaning part 1 for washing semiconductor wafers W and a drying part 2 for drying the wafers W. The cleaning part 1 is formed by a processing bath 10 storing a chemical liquid or a rinsing liquid. The processing bath 10 is communicated with a chemical source 17 and a pure water source 15 through a rinsing liquid pipeline 14 interposing an ozone water generating unit 21. After completing both chemical treatment and rinsing, it is possible to form the oxidation Elms on respective surfaces of the wafers W and dry them.

14 Claims, 5 Drawing Sheets

APPARATUS AND METHOD FOR CLEANING AND DRYING OBJECT

BACKGROUND OF THE INVENTION

1. Technical Field of the Invention

The present invention relates to an apparatus for cleaning (washing) and subsequently drying an object of treatment and a method of cleaning and drying the object. More in detail, it relates to the cleaning and drying apparatus for cleaning and subsequently drying objects of treatment, for example, semiconductor wafers, LCD glass substrates, etc. and also relates to the cleaning and drying method for the objects.

2. Description of the Related Art

In the general manufacturing process for the semiconductor devices, it is carried out to successively load the substrates, such as the semiconductor wafers or the LCD glass substrates, in a processing bath having a cleaning liquid, such as a chemical liquid or a rinsing liquid, and further perform the cleaning process, for example, the chemical treatment, the rinsing process, etc. in the processing bath. Thereafter, it is further carried out to eject dry gas against the substrates in order to eliminate moisture clinging to the substrates in the drying process.

In the above-mentioned manufacturing process, hydrogen fluoride (HF) is employed as the chemical liquid in order to eliminate natural oxidation films on the substrates. In the HF cleaning, however, the resultant substrate' surfaces are further activated, so that the contact of the substrates with air causes the natural oxidation films to be produced easily and also facilitates particle' sticking to the surfaces of the substrates. Therefore, it has been conventionally executed to dry the substrates (after the cleaning process) in an atmosphere of inert gas, for example, nitrogen ($N_2$) gas in order to make a situation being hard to form the oxidation films. However, if the substrates after the cleaning process are left in the air for a long time, then there are caused problems that the natural oxidation films are formed. on the surfaces of the substrates and the particles adhere to the surfaces.

Under the situation, it is recently adopted to positively form an protective oxidation film as one projection layer on each surface of the substrates in order to avoid the formation of the above natural oxidation film. As one method of forming the protective oxidation films positively, it is well known to dip the substrates in an ozone water to form the protective oxidation films thereon. As the method of producing the ozone water, there are known ① one method consisting of a step of passing oxygen between discharge electrodes thereby producing an ozone gas by the oxygen's discharging energy and a sequent step of dissolving the resultant ozone gas in a demineralized water (pure water) through an osmosis membrane or the like, thereby producing the ozone water; and ② another method consisting of a step of electrolyzing the pure water thereby directly producing both ozone gas and hydrogen gas and a sequent step of dissolving the resultant ozone gas in the pure water.

In the former method ①, however, there are problems that an ozone water generating unit is large-sized and its running cost is large due to the use of oxygen gas as the raw material. Additionally, because of its structure that the gas passes through the discharging electrodes directly, the particle as the result of discharging the electrodes are included in the gas and further dissolved in the pure water, so that the particles exist in the produced ozone water.

On the contrary, according to the latter method ② of electrolyzing the pure water, it takes a lot of time to generate the ozone water although the apparatus is small-sized. Furthermore, due to the generation of hydrogen gas as a by-product, the method does not only require a great deal of time in exhausting the hydrogen gas, but cause a problem in safety.

SUMMARY OF THE INVENTION

Accordingly, it is an object of the present invention to provide a cleaning and drying apparatus which is small-sized and capable of easily generating the ozone water without generating particles, hydrogen gas, etc. thereby forming the oxidation film on the object after washing and before drying. It is another object to provide a cleaning and drying method for an object.

The first feature of the invention resides in that the cleaning and drying apparatus for the object to be treated comprising: a cleaning chamber defined by a processing bath storing a chemical liquid or a rinsing liquid, for washing the object therein; a drying chamber enclosed with a container, for drying the object; a rinse source for supplying rinsing liquid to the processing bath; a rinse supplying pipeline connecting the rinse source with the processing bath; an ozone water generating mechanism provided on the rinse supplying pipeline.

With the constitution mentioned above, it is possible to change the rinsing liquid flowing in the rinsing liquid pipeline to the ozone water by the ozone wafer generating unit and also possible to supply the processing bath with the resultant ozone water. Further, it is possible to form the protective oxidation film on the substrate by dipping it in the ozone water. Accordingly, since the protective oxidation film is formed on the substrate after completing the chemical treatment, the subsequent drying allows preventing the formation of natural oxidation film on the substrate and also the adhering of particles to the substrate.

The second feature of the invention resides in a chemical source for supplying chemical liquid to the processing bath and a chemical supplying pipeline connecting the chemical source with the processing bath, wherein the chemical supplying pipeline is joined to the rinse supplying pipeline so as to supply the processing bath with either the mixture consisting of the chemical and the rinsing liquid or the rinsing liquid selectively.

The above-mentioned structure allows the chemical liquid line, the rinsing liquid line and the ozone water line to be united for piping, thereby attaining the miniaturization of the apparatus.

The third feature of the invention resides in that the ozone water generating mechanism is located in the rinse supplying pipeline between the rinse source and a junction where the chemical supplying pipeline is joined to the rinse supplying pipeline.

The fourth feature of the invention resides in a flow switching valve provided on the rinse supplying pipeline between the rinse source and the ozone water generating mechanism, the flow switching valve having a first position, a second position and a third position, the first position of the valve giving large quantity of flow when only pure water is provided to the processing bath in a process of rinsing, the second position of the valve giving medium quantity of flow when HF is provided to the processing bath in a process of eliminating natural oxidation film, the third position of the valve giving small quantity of flow when ozone water is provided to the processing bath in a process of forming an protective oxidation film.

The fifth feature of the invention resides in that the container enclosing the drying chamber having a cover covering an upper space of the processing bath and being provided on the processing bath detachably.

The sixth feature of the invention resides in that the container has a plurality of exhaust ports formed in the periphery of a lower part thereof, for discharging gas supplied into the drying chamber.

With the above-mentioned structure, it is possible to spread the supplied dry gas all over the drying chamber and subsequently discharge the dry gas quickly.

The seventh feature of the invention resides in that the ozone water generating mechanism is activated when forming protective oxidation film on the surface of the object, not activated when a process of rinsing by pure water or a process of eliminating natural oxidation film by HF.

Thus, the rinsing liquid can be used in both of the rinsing process and the oxidation film formation process.

The eighth feature of the invention resides in a temperature regulating mechanism provided on the rinse supplying pipeline between the rinse source and the ozone water generating mechanism for regulating temperature of the rinsing liquid.

With the constitution, it is possible to provide the rinsing process and the oxidation film forming process with the rinsing liquid or the ozone water supplied to the processing bath and also adjusted at a designated temperature.

The ninth feature of the invention resides in that the temperature regulating mechanism is activated and controls predetermined temperature of hot ozone water, hot pure water and hot HF respectively, where a processing liquid is needed to be higher temperature than normal temperature such as when forming a protective oxidation film with hot ozone water, when rinsing the object with hot pure water and when eliminating natural oxidation film with hot HF.

Therefore, it is possible to provide the rinsing process and the oxidation film forming process with the rinsing liquid or the ozone water flowing in the pipeline for the rinsing liquid, which is adjusted at a designated temperature as occasion demands.

The tenth feature of the invention resides in that the cleaning and drying apparatus further comprises a magnetic field generating unit interposed in the pipeline for the rinsing liquid, on the upstream side of the ozone water generating unit.

With the constitution mentioned above, when the rinsing liquid in the pipeline for the rinsing liquid passes through the magnetic field produced by the magnetic field generating unit, the rinsing liquid is subjected to magnetism. Consequently, the bonding angles of molecules of the rinsing liquid can be uniformed thereby improving the producing efficiency of the ozone water.

The 11th feature of the invention resides in that pure water is employed as the rinsing liquid, the ozone water generating mechanism has a transparent pipe through which pure water passes and an ultraviolet lamp irradiating the pure water in the transparent pipe with ultraviolet rays.

With the constitution mentioned above, it is possible to produce the ozone water by irradiating the ultraviolet rays on the pure water flowing in the pipeline for the rinsing liquid.

The 12th feature of the invention resides in that the ultraviolet lamp is surrounded by the transparent pipe in central part of the transparent pipe.

The 13th feature of the invention resides in that the cleaning and drying apparatus further comprises a dry gas source communicated with the drying chamber through a dry gas pipeline.

With the constitution mentioned above, it is possible to supply the dry gas to the object after the chemical treatment, the rinsing process and the oxidation film forming process, thereby drying the object.

The 14th feature of the invention resides in that the cleaning and drying further comprises a heating unit interposed in the dry gas pipeline. Accordingly, since the dry gas of high temperature is supplied to the object, it is possible to improve the drying efficiency of the object.

The 15th feature of the invention resides in a cleaning and drying apparatus for an object of treatment, comprising: a cleaning chamber defined by a processing bath storing a chemical liquid or a rinsing liquid, for washing the object therein; a drying chamber enclosed with a container, for drying the object; a chemical source. supplying chemical liquid to the processing bath; a rinse source supplying rinsing liquid to the processing bath; a rinse supplying pipeline connecting the rinse source with the processing bath; an ozone water generating mechanism provided on the rinse supply pipeline for producing ozone water; a temperature regulating mechanism provided on the rinse supplying pipeline between the ozone water generating mechamism and the rinse source, for adjusting temperature of pure water supplied to the ozone water generating mechanism; a magnetic field generating mechanism provided on the rinse supplying pipeline between the ozone water generating mechanism and the rinse source, for applying magnetic field on the pure water supplied to the ozone water generating mechanism; and a controler for controlling the operations of the ozone water generating mechanism, the temperature regulating mechanism and the magnetic field generating mechanism.

The 16th feature of the invention resides in that the controler is operable of the operations of the ozone water generating mechanism, the temperature regulating mechanism and the magnetic field generating mechanism, selectively.

With the above constitution, the apparatus is capable of complying with a variety of cleaning/drying conditions, thereby accomplishing the most suitable treatment and the automated treatment.

The 17th feature of the invention resides in a cleaning and drying method for an object to be treated, comprising the steps of: dipping the object to be treated in a chemical liquid thereby washing the object; dipping the object in a rinsing liquid thereby rinsing the object; dipping the object in an ozone water thereby forming an oxidation film on the surface of the object; and supplying the object having the oxidation film with dry gas thereby drying the, object.

The 18th feature of the invention resides in that in the step of rinsing the object or the step of forming the oxidation film of the object, it is executed to supply the rinsing liquid or the ozone water each adjusted at a predetermined temperature.

The 19th feature of the invention resides in that in the step of forming the oxidation film on the surface of the object, it is executed to use pure water as the rinsing liquid and also use the ozone water resulting from irradiating ultraviolet rays on the pure water.

The 20th feature of the invention resides in that it is executed to apply magnetic field on the pure water before generating the ozone water.

The above and other features and advantages of this invention will become apparent, and the invention itself will best be understood, from a study of the following description and appended claims, with reference had to the attached drawings showing one preferred embodiment of the invention.

DESCRIPTION OF THE PREFERRED EMBODIMENT

Embodiments of the present invention will be described in detail with reference to FIGS. 1 to 5. Throughout the embodiments, the present invention will be described in case of the application on a cleaning and drying process for semiconductor wafers.

Figure 1:
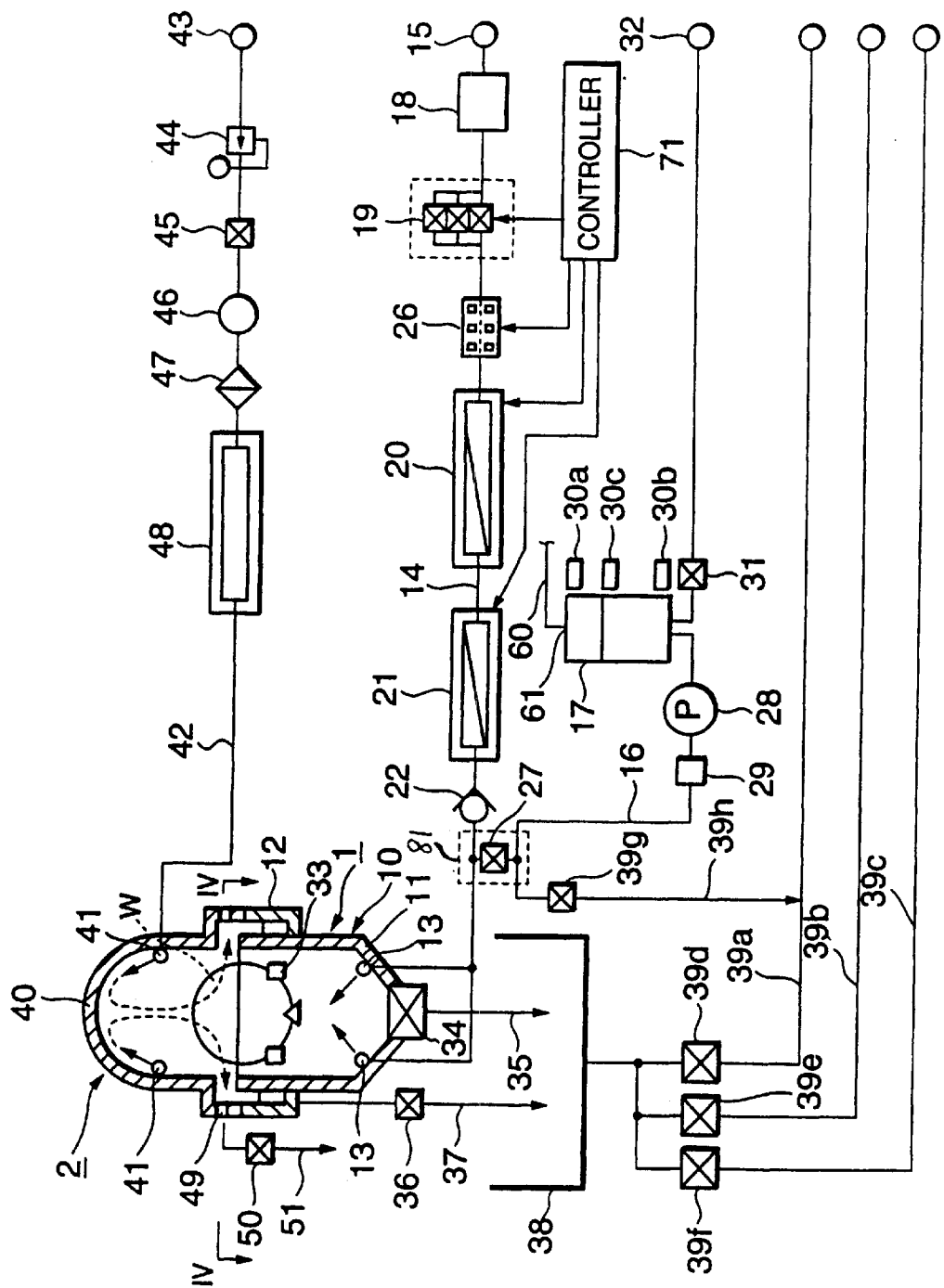
FIG. 1 is a schematic view showing the cleaning and drying apparatus in accordance with one embodiment of the present invention.

FIG. 1 is a schematically sectional view showing the cleaning and drying apparatus in accordance with one embodiment of the present invention.

The cleaning and drying apparatus comprises an essential part consisting of a cleaning (or washing) part 1 and a drying part 2 for semiconductor wafers W to be processed, which will be referred as "wafers W", hereinafter.

In the cleaning part 1, the wafers W are subjected to the chemical treatment using a chemical liquid, for example, hydrogen fluoride (HF). Thereafter, it is further executed in the part 1 to rinse the wafers W by using a rinsing liquid, for example, pure water (or demineralized water) and simultaneously form the oxidation films on the wafers W by using an ozone water. While, in the drying part 2, it is executed to eliminate moisture clinging onto the surfaces of the wafers W during the cleaning process.

The cleaning part 1 has a processing bath 10 for storing the cleaning liquid, such as the pure water and the ozone water. The processing bath 10 consists of an inner bath 11 for storing the above cleaning liquid and an outer bath 12 for receiving the cleaning liquid overflowing an upper opening of the inner bath 11. On the lower part of the inner bath 11, nozzles 13 in pairs are arranged to supply the cleaning liquid. The nozzles 13 in pairs are communicated with to a source for the rinsing liquid, namely, a pure water source 15 through a rinsing liquid pipeline 14. Further, the nozzles 13 are also communicated with a chemical source, for example, a HF supply tank 17 through a chemical liquid pipeline 16 connected to the rinsing liquid pipeline 14 at a juncture 81 on its way to the pure water source 15.

In the rinsing liquid pipeline 14, there are interposed a flow (pressure) controller 18, a flow switching valve 19, a temperature regulating unit 20, an ozone water generating unit 21 and a check valve 22, in order from the side of the pure water source 15. In this arrangement, the ozone water generating unit 21 is positioned between the juncture 81 and the pure water source 15, therefore, is located on an upstream side of the juncture. Accordingly, there is no possibility that ozone water generating unit 21 is z eroded or damaged by chemical liquid even if the pipe line was destroyed. Furthermore, it can prevent the chemical liquid from reacting to the ultraviolet rays abnormally.

Also, the check valve 22 is located on an upstream side of the juncture 81 where pure water as rinsing liquid and HF as chemical liquid are flow together, is positioned between the juncture 81 and the ozone water generating unit 21. This check valve 22 permits the pure water to flow only in a direction from the pure water source 15 to the processing bath 10 and prevent HF liquid from flowing into the ozone generating unit 21. Accordingly, the check valve 22 can prevent the abnormal reaction of the chemical liquid in the ozone generating unit to enhance safety of the apparatus.

Note that the temperature regulating unit 20 is constructed in the form of a hot-water generator capable of selective operation (ON, OFF), for example, a halogen lamp type generator allowing the pure water flowing in the rinsing liquid pipeline 14 to be heated up to a designated temperature (e.g. 60° C.) as occasion demands.

Figure 2:
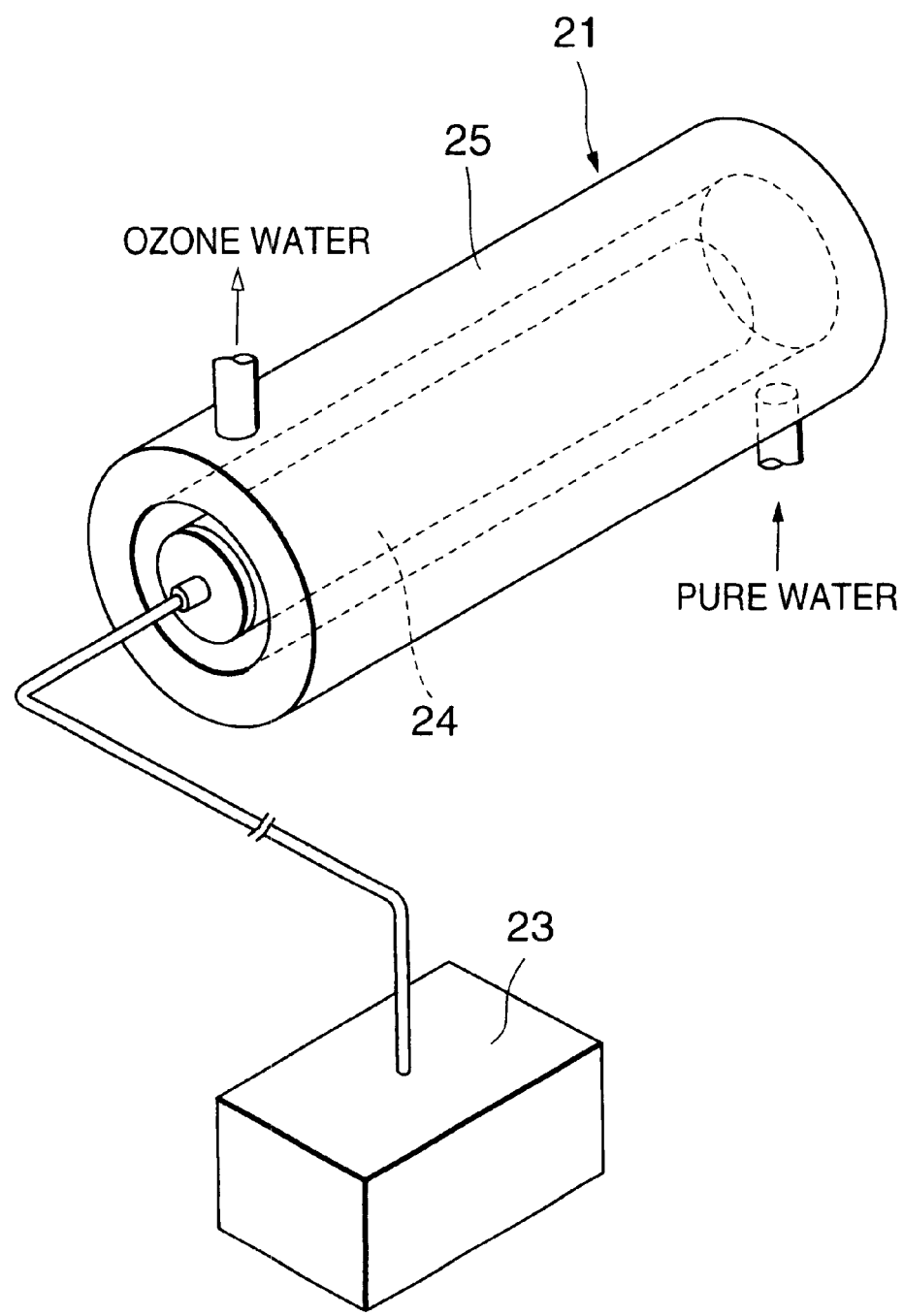
FIG. 2 is a schematically perspective view showing an ozone-generating unit of the invention.

As shown in FIG. 2, the ozone water generating unit 21 is constructed in the form of an ultraviolet irradiation type ozone water generator which includes, for example, an ultraviolet irradiation lamp 24 capable of selective operation (ON, OFF) by a controller 23. In the embodiment shown in FIG. 2, a transparent cylindrical tube 25 of e.g. silica is connected to a part of the rinsing liquid pipeline 14 and the ultraviolet irradiation lamp 24 is disposed at the center of the transparent cylindrical tube 25. In this way, since the ultraviolet rays are irradiated on the pure water flowing in the cylindrical tube 25 as occasion demands, the ozone water generating unit 21 can change the pure water into the ozone water directly. The most important feature of this ozone water generating unit 21 is that this unit can produce ozone water by using a mechanism shown in FIG. 2 and ultraviolet rays having predetermined intensity and frequency without using oxygen in atmosphere, being different from the other ozone water generating unit using pure water, ultraviolet rays and oxygen in atmosphere.

Figure 3:
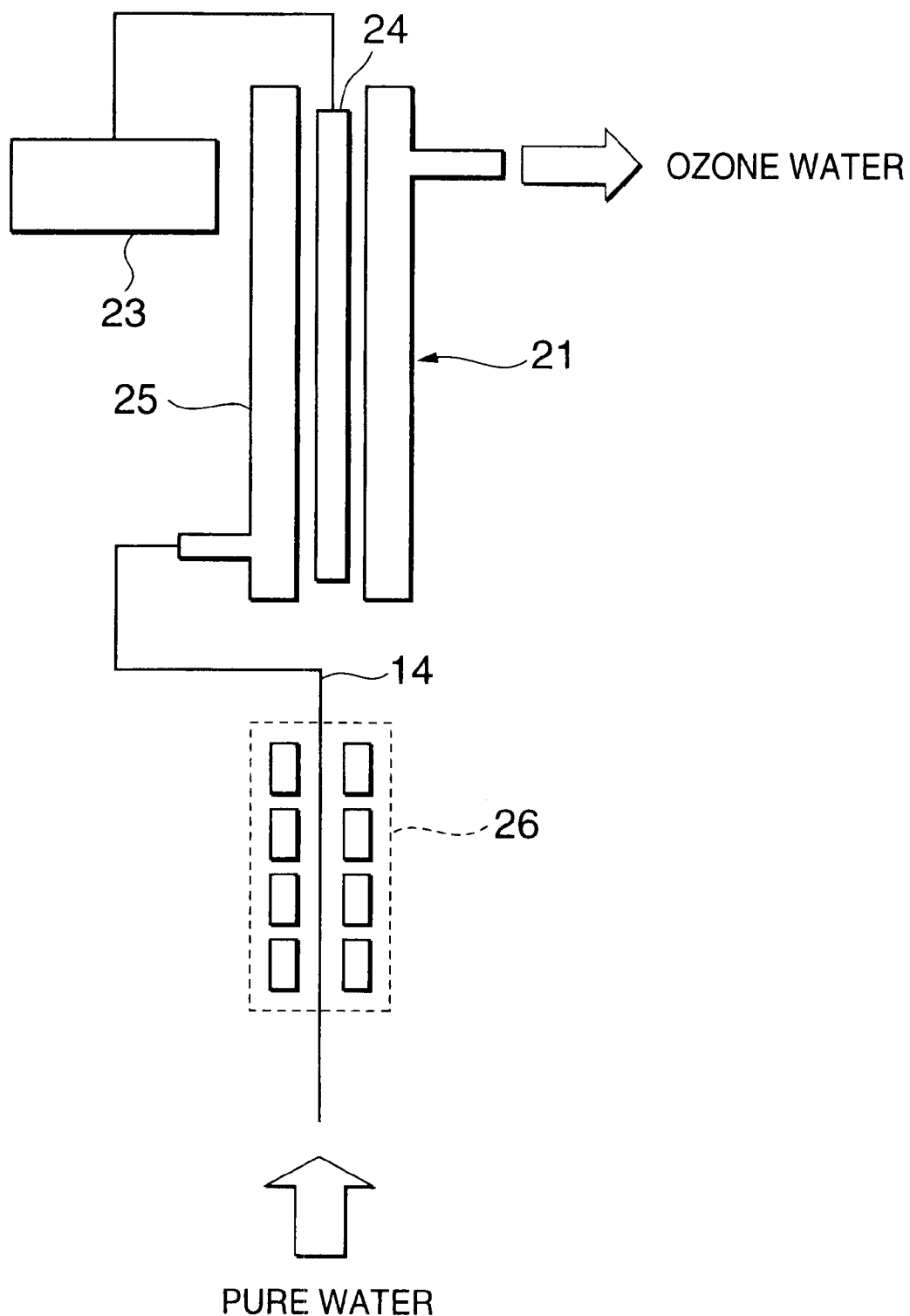
FIG. 3 is a schematically sectional view showing an essential part of the cleaning and drying apparatus in accordance with another embodiment of the present invention.

As shown in FIG. 3, it is preferable to interpose a magnetic field generating unit 26, which may be formed by super high-potency magnets, electromagnets, etc., on the upstream side of the ozone water generating unit 21 in the rinsing liquid pipeline 14. In this case, the magnetic field generating unit 26 is adapted so as to be selectively operable (ON, OFF;). Thus, owing to the arrangement of the magnetic field generating unit 26 on the upstream side of the ozone water generating unit 21, the pure water flowing from the pure water source 15 to the rinsing liquid pipeline 14 passes through the magnetic field thereby taking magnetism. Consequently, the pure water is easy to accept the ultraviolet energy from the ultraviolet irradiation lamp 24 of the ozone water generating unit 21, thereby causing the generating efficiency of the ozone water to be elevated by about 15%. This is because the magnetization of the pure water allows the bonding angles of water molecules to be uniformed thereby regulating the relationship against the wavelengths of the ultraviolet rays.

The temperature regulating unit 20, the ozone water generating unit 21 and the magnetic field generating unit 26 are all connected to a control unit 71. The control unit 71 is adapted so as to control the ON/OFF operation of the ozone water generating unit 21, the irradiation intensity of the ultraviolet irradiation lamp 24, the ON/OFF operation of the temperature regulating unit 20, the setting in temperature of the same unit 20, the ON/OFF operation of the magnetic field generating unit 26, the intensity and direction of field generated by the unit 26, etc. Thus, it is possible to establish various operations of the ozone water generating unit 21 etc. corresponding to a variety of treatment conditions desired for the wafers W. thereby allowing the treatment to be automated while realizing the most suitable treatment.

Meanwhile, the chemical liquid pipeline 16 is connected to the rinsing liquid pipeline 14 via the switching valve 27.

Between the switching valve 27 and the HF supply tank 17, there are interposed a pump 28 and a back pressure valve 29. The back pressure valve 29 opens at the time of exceeding a predetermined pressure, in order from the side of the HF supply tank 17. Therefore, only when pump 28 work, the back pressure valve 29 opens to allow HF liquid to flow from the HF supply tank 17 through the switching valve 27 and to mix with the pure water. In this situation, if pressure and flow rate of the pure water rise, the back pressure valve can prevent the HF liquid and the pure water from flowing reversely to avoid risk such as damage of the tank.

In the vicinity of the outside of the HF supply tank 17, respective level sensors 30a to 30c for detecting an upper limit of the stored liquid, the lower limit and the allowable level respectively are arranged in order to monitor the quantity of HF in the tank 17. Further, the HF supply tank 17 is communicated with the HF source 32 through a pipeline interposing an open/close valve 31, allowing the HF supply tank 17 to be supplied with a predetermined quantity of HF. Note that reference numeral 60 designates a pipe that is connected to a suction port 61 in order to make a normal pressure in the HF supply tank 17.

As mentioned above, the confluence (connection) of the rinsing liquid pipeline 14 connected to the nozzles 13 on the lower part of the processing bath 10 with the chemical liquid pipeline 16 allows the pure water flowing in the pipeline 14 to be mixed with a predetermined quantity of HF, thereby supplying the processing bath 10 with a chemical liquid (DHF) having a designated density. Therefore, after completing the chemical treatment of the wafers W. that is, the elimination of the natural oxidation films on the wafer' surfaces, the turn of the switching valve 27 to its drain side and stop of the operation of the pump 28 allows the processing bath 10 to be supplied with only the pure water, thereby executing the rinsing process to remove the chemical liquid, i.e., HF adhering to the surfaces of the wafers W At that time, if the hot-water generating unit 20 is operated, then it is possible to perform the rinsing process while supplying hot pure water obtained by heating the pure water to a predetermined temperature. Additionally, the operation of the ozone water generating unit 21 succeeding the rinsing process would cause the pure water to be irradiated with ultraviolet rays thereby producing the ozone water. That is, it is possible to supply the processing bath 10 with the ozone water for forming the oxidation films on the wafers W.

The apparatus is constructed so as to load the wafers W of the plural number (e.g. fifty) into the processing bath 10 or unload the wafers W therefrom by a not-shown elevating mechanism. A first drain pipe 35 is connected to a drain port (not shown) on the bottom of the inner bath 11 of the processing bath 10 through a first drain valve 34. A drain port (not shown) on the bottom of the outer bath 12 is connected to a second drain pipe 37 interposing a second drain valve 36. The drain liquid discharged from the first and second drain pipes 35, 37 is collected into a drain pan 38. To the drain pan 38, there are connected three kinds of drain pipelines, that is, a "thick" drain pipeline 39a for strong HF in density, a "thin" drain pipeline 39b for weak HF in density and a drain pipeline 39c for the pure/ozone water. The drain pipelines 39a, 39b, 39c are respectively provided with switching valves 39d, 39e, 39f for leading the waste HF, waste pure water and waste ozone water discharged from the processing bath 10 into designated exterior positions separately. The drain pipeline 39a is also communicated with a drain port (not shown) of the switching valve 27 of the chemical liquid pipeline 16 through a drain pipe 39 including a drain valve 39g.

On the other hand, the drying part 2 is formed by a closed cover 40 of a substantial U-shaped section, which is arranged above the processing bath 10 through a not-shown seal packing. The cover 40 is adapted so as to be approachable or separable in relation to the processing bath 10 by a not-shown elevating mechanism. In this way, the drying part 2 is formed above and closely to the processing bath. Therefore, it is possible to shorten the time needed for transferring the wafer into the drying part 2 after exposing the wafer to atmosphere in the processing bath 10. Moreover, the size of the transferring mechanism can be minimized, because it needs only an elevating mechanism without others.

On an upper part of the interior of the cover 40, gas nozzles 41 in pairs are arranged so that their ejection holes direct upward. The gas nozzles 41 are connected with a gas source 43 for dry gas (e.g. $N_2$ gas) through a gas pipeline 42. In the gas pipeline 42, there are successively interposed a flow regulating valve 44, an open/close valve 45, a flow meter 46, a filter 47 and a heater 48 as a heating unit, in order from the $N_2$ gas source 43.

With the constitution mentioned above, it is possible to eject $N_2$ gas, which has been heated up to a designated temperature (e.g. 170° C.) by the heater 48, into the cover 40 via the gas nozzles 41, thereby drying the wafers W in the cover 40.

Figure 4:
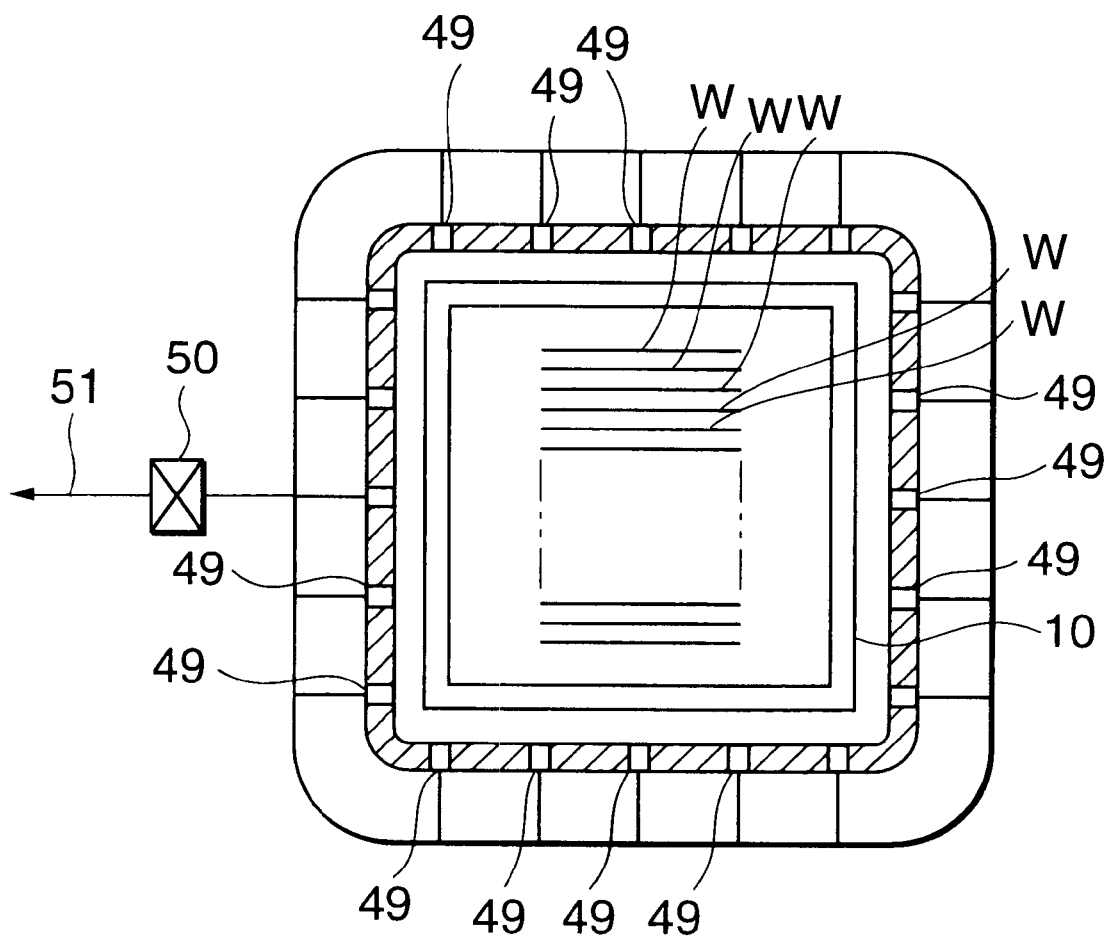
FIG. 4 is a sectional view taken along a line IV—IV of FIG. 1.

As shown in FIG. 4, on a lower side part of the cover 40, there are provided, at regular intervals in the circumferential direction, a plurality of exhaust ports 49 which are communicated with an exhaust pipeline 51 interposing an open/close valve 50.

Owing to the arrangement of the exhaust ports 49 at regular or appropriate intervals in the circumferential direction of the cover 40, the dry gas ejected into the cover 40 via the nozzles 41 once rises toward the top part of the cover 40 and subsequently spreads over the whole cover 40. Thereafter, the dry gas is discharged through the plural exhaust ports 49 equally arranged about the lower part of the cover 40. Thus, it is possible to circulate the dry gas in the cover 40 widely. Accordingly, the occurrence of uneven drying depending on the wafers' position can be prevented to perform both uniform drying and quick exhausting of the gas.

As mentioned above, since the pair of gas nozzles 41 on the upper part in the cover 40 have the ejection holes directing upward and the plural exhaust ports 49 are arranged on the lower side part of the cover 40 at regular intervals in the circumferential direction, the dry gas ($N_2$ gas) ejected from the gas nozzles 41 firstly flows along the curved ceiling face of the cover 40 and subsequently flows from the top of the cover 40 toward the exhaust ports 49 as shown with arrows of FIG. 1. Therefore, as the dry gas ($N_2$ gas) comes into uniform contact with the surfaces of the wafers W, it is possible to progress the drying.

Figure 5:
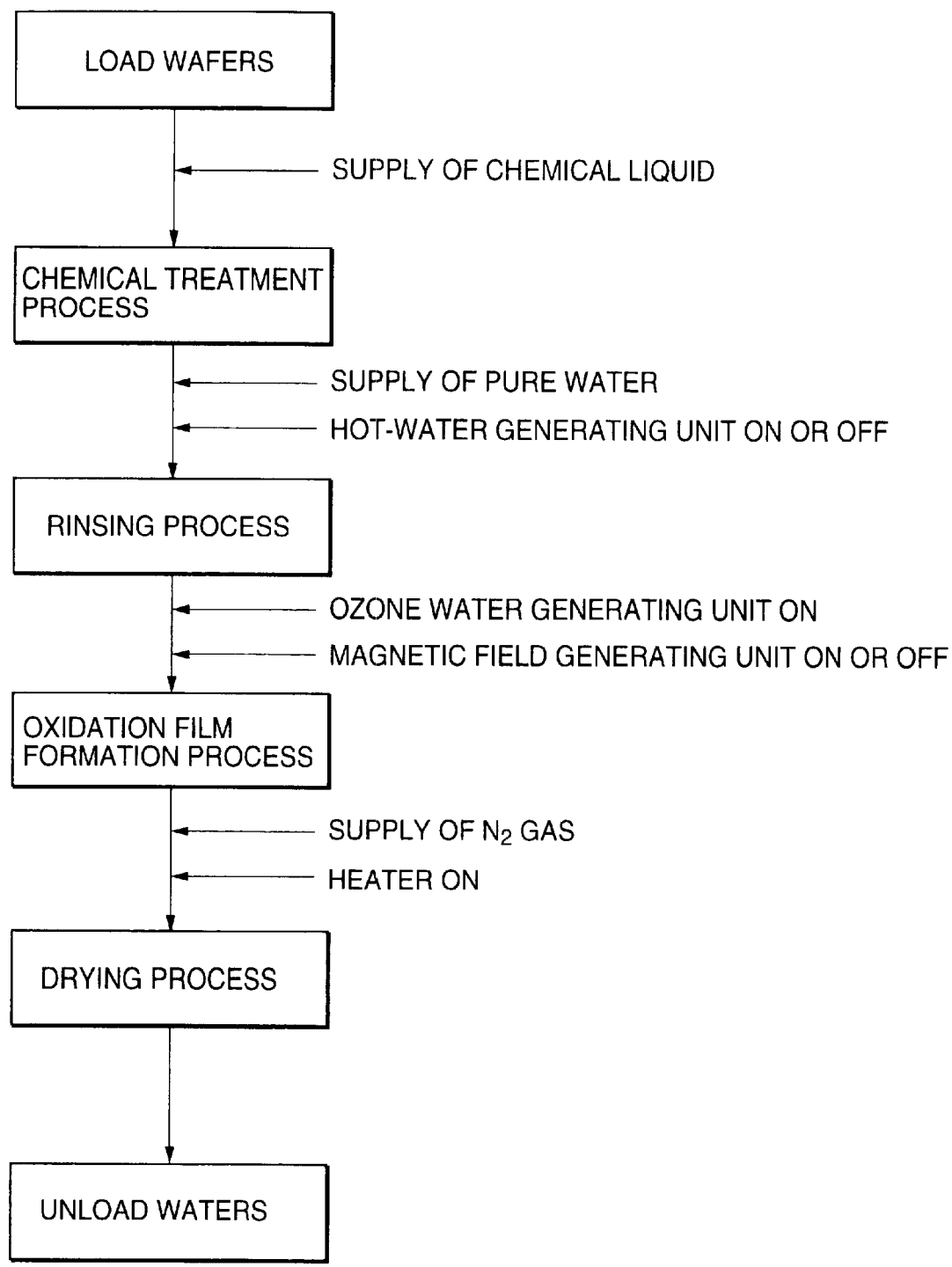
FIG. 5 is a flow chart showing one example of steps of the cleaning and drying method of the invention.

Next, with reference to FIGS. 1 and 5, we describe the procedures for cleaning the wafers W, forming the oxidation films thereon and drying the wafers W by the above cleaning and drying apparatus.

First of all, the wafer boat 33 receives the wafers W of the plural number (e.g. 50 pieces), which have been brought by a not-shown transporting unit, for example, a wafer chuck and stands ready above the processing bath 10. Then, the cover 40 drops thereby to insulate the upside of the processing bath 10 from the air outside. Next, due to the drive of the not-shown elevating mechanism, the wafer boat 33 falls in order to load (accommodate) the wafer W in the processing bath 10. Now, turn the switching valve 27 to the side of the rinsing liquid pipeline 14 while turning the flow regulating valve 19 to the side for supplying the liquid to the processing bath 10. Simultaneously, drive the pump 28 to charge a predetermined amount of HF into the pure water flowing through the rinsing liquid pipeline 14 from the pure water source 15, thereby supplying the chemical liquid (DHF-demineralized HF) of designated density into the inner bath 11 of the processing bath 10, while overflowing the bath 11 into the outer bath 12. In this way, by dipping the wafers W in the DBF, the natural oxidation films of the wafers W are eliminated (chemical treatment). During this chemical treatment process, the second drain valve 36 opens, so that the chemical liquid overflowing the inner bath 11 is discharged to the drain pan 38 through the second drain pipe 37.

After executing the chemical treatment process at a predetermined period, open the first drain valve 34 thereby discharging the chemical liquid (DHF) in the inner bath 11 to the drain pan 38. Next, after discharging all the chemical liquid or discharging it to some extent, turn the switching valve 27 to the side of the first drain pipeline 39a while closing the first drain valve 34. Simultaneously, stop to operate the pump 28 in order to supply the processing bath 10 with only the pure water. In this way, by dipping the wafers W in the pure water, the chemical liquid adhering to the wafers W are eliminated (rinsing process). In another way of rinsing process, it is acceptable that after executing the chemical treatment process at a predetermined period, pure water is provided through the nozzle 13 into the inner bath 11 while making chemical liquid overflow the inner bath 11 into the outer bath to gradually replace chemical liquid in the inner bath 11 into pure water. In this way, it is possible to change over from the chemical treatment into the rinsing process. Also in this rinsing process, the pure water overflows the inner bath 11 into the outer bath 12 and flows into the drain pan 38 through the second drain pipe 37.

After executing the rinsing process at a predetermined period, while flowing the pure water through the rinsing liquid pipeline 14, the ozone water generating unit 21 is operated to irradiate the ultraviolet rays from the ultraviolet irradiation lamp 24 to the pure water, thereby producing the ozone water of a designated concentration, for example, 0.5 PPM to 2.0 PPM. The resultant ozone water is supplied to the processing bath 10 for dipping the wafers W in the ozone water, thereby forming the protective oxidation films on the wafers W (protective oxidation film forming process). Then, if coming the wafers W into contact with the ozone water of e.g. 1 PPM for 5 to 6 minutes, then the oxidation film of about 2 to 3 Å in thickness can be formed on each wafer. Further, if the hot water generating unit 20 is operated to heat the pure water (before being ozonized) up to a designated temperature, for example, 20° C. and the resultant hot ozone water is supplied to the processing bath 10, then it is possible to accomplish the formation of oxidation films effectively. Alternatively, if the pure water before being ozonized is subjected to magnetism upon the operation of the magnetic field generating unit 26, then it is easy for the pure water to receive the ultraviolet energy from the ultraviolet irradiation lamp 24 of the ozone water generating unit 21, whereby the generating efficiency of ozone water can be elevated by the order of 15%. Note that, in this oxidation film forming process, the ozone water overflows the inner bath 11 into the outer bath 12 and flows into the drain pan 38 through the second drain pipe 37.

After forming the oxidation films on the wafers W in the above way, elevate the wafer boat 33 to pick up the wafers W from the rinsing liquid (ozone water) and further open the open/close valve 45 in the dry gas pipeline 42 to eject the dry gas (i.e. $N_2$ gas) into the drying part 2, namely, the cover 40 through the gas nozzles 42. As the result, $N_2$ gas supplied from the nozzles 41 firstly flows along the curved ceiling face of the cover 40 and subsequently flows from the top toward the lower exhaust ports 49, as shown with the arrows of broken lines of FIG. 1. In this way, the so-introduced $N_2$ gas comes into uniform contact with the wafers W in the cover 40 thereby drying them (drying process). At this time, since $N_2$ gas is heated by the heater 48, it is possible to perform the drying process effectively.

After completing the drying process in the above way, close the open/close valve 45 to stop the supply of $N_2$ gas. After the cover 40 is elevated, the dried wafers W are delivered from the wafer boat 33 to the wafer chuck moving to the side of the wafer boat 33 and transported to the next-coming process.

In this way, the chemical treatment process of the wafer W, the rinsing process, the oxidation film forming process and the drying process are successively carried out.

Although the cleaning and drying apparatus of the present invention is applied on the processing system for the semiconductor wafers in the above-mentioned embodiment, the present invention is also applicable to other substrates beside the semiconductor wafers, for example, LCD glass substrates.

As mentioned above, according to the invention, the rinsing liquid flowing in the rinsing liquid pipeline is changed to the ozone water by the ozone wafer generating unit and the resultant ozone water is supplied into the processing bath. Thus, since the protective oxidation films are formed on the substrates by dipping them in the ozone water, in other words, the protective oxidation films are formed on the substrates after completing the chemical treatment, the subsequent drying allows to prevent the formation of natural oxidation films on the substrates and also the adhering of particles to the substrates. In this case, since the ozone water generating unit is constructed so as to be operable selectively, it is possible to change the rinsing liquid being supplied to the processing bath through the rinsing liquid pipeline into the ozone water as occasion demands, whereby the rinsing liquid can be used for the rinsing process and the oxidation film formation process.

What is claimed is:

1. A cleaning and drying apparatus for an object to be treated, comprising:

a cleaning chamber defined by a processing bath storing a chemical liquid or a rinsing liquid, for washing the object therein;

a drying chamber defined by a container, for drying the object;

a chemical source for supplying chemical liquid for eliminating natural oxidation film from the object to the processing bath;

a rinse source for supplying rinsing liquid to the processing bath;

a rinse supplying pipeline connecting the rinse source with the processing bath;

an ozone water generating mechanism, provided on the rinse supplying pipeline, for generating ozone water for forming protective oxidation film on the object; and a chemical supplying pipeline connecting the chemical source with the processing bath, wherein the chemical supplying pipeline is joined to the rinse supplying pipeline so as to supply the processing bath with either the mixture liquid consisting of the chemical and the rinsing liquid or the rinsing liquid selectively, and wherein the ozone water generating mechanism is located in the rinse supplying pipeline between the rinse source and a junction where the chemical supplying pipeline is joined to the rinse supplying pipeline.

2. A cleaning and drying apparatus as claimed in claim 1, wherein the container, defining the drying chamber has a cover covering an upper space of the processing bath and being provided on the processing bath detachably.

3. A cleaning and drying apparatus as claimed in claim 1, wherein the container has a plurality of exhaust ports formed in the periphery of a lower part thereof, for discharging gas supplied into the drying chamber.

4. A cleaning and drying apparatus as claimed in claim 1, wherein the ozone water generating mechanism is activated when forming protective oxidation film on the surface of the object, not activated when a process of rinsing only by rinsing liquid or a process of eliminating natural oxidation film by chemical liquid.

5. A cleaning and drying apparatus as claimed in claim 1, further comprising a dry gas source communicating with the drying chamber through a dry gas pipeline.

6. A cleaning and drying apparatus as claimed in claim 5, further comprising a gas heating mechanism provided on the dry gas pipeline.

7. A cleaning and drying apparatus for an object to be treated, comprising:

a cleaning chamber defined by a processing bath storing a chemical liquid or a rinsing liquid, for washing the object therein;

a drying chamber defined by a container, for drying the object;

a chemical source for supplying chemical liquid for eliminating natural oxidation film from the object to the processing bath;

a rinse source for supplying rinsing liquid to the processing bath;

a rinse supplying pipeline connecting the rinse source with the processing bath;

an ozone water generating mechanism, provided on the rinse supplying pipeline, for generating ozone water for forming protective oxidation film on the object; and a flow switching valve provided on the rinse supplying pipeline between the rinse source and the ozone water generating mechanism, the flow switching valve having a first position, a second position and a third position, the first position of the valve giving large quantity of flow when only rinsing liquid is provided to the processing bath, the second position of the valve giving medium quantity of flow when chemical liquid is provided to the processing bath, the third position of the valve giving medium quantity of flow when ozone water is provided to the processing bath.

8. A cleaning and drying apparatus for an object to be treated, comprising:

a cleaning chamber defined by a processing bath storing a chemical liquid or a rinsing liquid, for washing the object therein;

a drying chamber defined by a container, for drying the object;

a chemical source for supplying chemical liquid for eliminating natural oxidation film from the object to the processing bath;

a rinse source for supplying rinsing liquid to the processing bath;

a rinse supplying pipeline connecting the -rinse source with the processing bath;

an ozone water generating mechanism, provided on the rinse supplying pipeline, for generating ozone water for forming protective oxidation film on the object; and a temperature regulating mechanism provided on the rinse supplying pipeline between the rinse source and the ozone water generating mechanism for regulating temperature of the rinsing liquid.

9. A cleaning and drying apparatus as claimed in claim 8, wherein the temperature regulating mechanism is activated and controls predetermined temperature of hot ozone water, hot rinsing liquid and hot chemical liquid respectively, where a processing liquid is needed to be higher temperature than normal temperature such as when forming a protective oxidation film with hot ozone water, when rinsing the object with hot rinsing liquid and when eliminating natural oxidation film with hot chemical liquid.

10. A cleaning and drying apparatus for an object to be treated, comprising:

a cleaning chamber defined by a processing bath storing a chemical liquid or a rinsing liquid, for washing the object therein;

a drying chamber defined by a container, for drying the object;

a chemical source for supplying chemical liquid for eliminating natural oxidation film from the object to the processing bath;

a rinse source for supplying rinsing liquid to the processing bath;

a rinse supplying pipeline connecting the rinse source with the processing bath;

an ozone water generating mechanism, provided on the rinse supplying pipeline, for generating ozone water for forming protective oxidation film on the object; and a magnetic field generating mechanism provided on the rinse supplying pipeline, on the upstream side of the ozone water generating mechanism.

11. A cleaning and drying apparatus for an object to be treated, comprising:

a cleaning chamber defined by a processing bath storing a chemical liquid or a rinsing liquid, for washing the object therein;

a drying chamber defined by a container, for drying the object;

a chemical source for supplying chemical liquid for eliminating natural oxidation film from the object to the processing bath;

a rinse source for supplying rinsing liquid to the processing bath;

a rinse supplying pipeline connecting the rinse source with the processing bath;

an ozone water generating mechanism, provided on the rinse supplying pipeline, for generating ozone water for forming protective oxidation film on the object, wherein pure water is employed as the rinsing liquid, the ozone water generating mechanism has a transparent pipe through which pure water passes and an ultraviolet lamp irradiating the pure water in the transparent pipe with ultraviolet rays.

12. A cleaning and drying apparatus as claimed 11, wherein the ultraviolet lamp is surrounded by the transparent pipe in central part of the transparent pipe.

13. A cleaning and drying apparatus for an object of treatment, comprising:
- a cleaning chamber defined by a processing bath storing a chemical liquid or a rinsing liquid, for washing the object therein;
- a drying chamber defined by a container, for drying the object;
- a chemical source supplying chemical liquid to the processing bath;
- a rinse source supplying rinsing liquid to the processing bath;
- a rinse supplying pipeline connecting the rinse source with the processing bath;
- an ozone water generating mechanism provided on the rinse supply pipeline for producing ozone water
- a temperature regulating mechanism provided on the rinse supplying pipeline between the ozone water generating mechamism and the rinse source, for adjusting temperature of rising liquid supplied to the ozone water generating mechanism;
- a magnetic field generating mechanism provided on the rinse supplying pipeline between the ozone water generating mechanism and the rinse source, for applying magnetic field on the rinsing liquid supplied to the ozone water generating mechanism; and
- a controler for controlling the operations of the ozone water generating mechanism, the temperature regulating mechanism and the magnetic field generating mechanism.

14. A cleaning and drying apparatus as claimed in claim 13, wherein
- the controler is operable of the operations of the ozone water generating mechanism, the temperature regulating mechanism and the magnetic field generating mechanism, selectively.

* * * * *